United States Patent
Xu et al.

(10) Patent No.: US 9,306,279 B2
(45) Date of Patent: Apr. 5, 2016

(54) WIRELESS TERMINAL

(71) Applicant: Huawei Device Co., Ltd., Shenzhen (CN)

(72) Inventors: Huiliang Xu, Shenzhen (CN); Yao Lan, Shenzhen (CN); Shuhui Sun, Shenzhen (CN); Dongxing Tu, Shenzhen (CN); Dingjie Wang, Shenzhen (CN); Ping Lei, Shenzhen (CN); Peihua Shuai, Shenzhen (CN)

(73) Assignee: Huawei Device Co., Ltd., Shenzhen (CN)

( * ) Notice: Subject to any disclaimer, the term of this patent is extended or adjusted under 35 U.S.C. 154(b) by 285 days.

(21) Appl. No.: 13/952,275

(22) Filed: Jul. 26, 2013

(65) Prior Publication Data

US 2013/0314296 A1 Nov. 28, 2013

Related U.S. Application Data

(63) Continuation of application No. PCT/CN2012/070585, filed on Jan. 19, 2012.

(30) Foreign Application Priority Data

Jan. 27, 2011 (CN) .......................... 2011 1 0030267

(51) Int. Cl.
*H01Q 3/02* (2006.01)
*H01Q 3/04* (2006.01)
(Continued)

(52) U.S. Cl.
CPC .............. *H01Q 3/04* (2013.01); *H04B 1/3816* (2013.01); *H05K 1/0227* (2013.01); *H05K 2201/09972* (2013.01)

(58) Field of Classification Search
CPC ...................................... H01Q 1/725
USPC ........................................... 343/882
See application file for complete search history.

(56) References Cited

U.S. PATENT DOCUMENTS

| | | | |
|---|---|---|---|
| 2010/0080242 | A1 | 4/2010 | Chen et al. |
| 2010/0161865 | A1 | 6/2010 | Xie et al. |

(Continued)

FOREIGN PATENT DOCUMENTS

| | | | |
|---|---|---|---|
| CN | 201197148 | Y | 2/2009 |
| CN | 101442331 | A | 5/2009 |

(Continued)

OTHER PUBLICATIONS

Chinese Office Action received in Application No. 201110030267.1 mailed Feb. 5, 2013, 6 pages.

(Continued)

*Primary Examiner* — Graham Smith
(74) *Attorney, Agent, or Firm* — Slater & Matsil, L.L.P.

(57) ABSTRACT

Embodiments of the present invention provide a wireless terminal including a PCB, an antenna, and a data connector. The PCB has a groove, which divides the PCB into a first part and a second part. The second part is connected to the antenna, the first part is connected to the data connector through a rotating shaft, and connecting wires of the data connector are connected to the second part. The first part and the second part each have a ground. The ground of the first part is connected to a metal casing of the data connector and a ground wire of the data connector is connected to the ground of the second part and the ground wire of the data connector is electrically connected to the metal casing of the data connector.

19 Claims, 2 Drawing Sheets

(51) Int. Cl.
*H04B 1/3816* (2015.01)
*H05K 1/02* (2006.01)

(56) References Cited

U.S. PATENT DOCUMENTS

| 2011/0188211 | A1 | 8/2011 | Zhao | |
|---|---|---|---|---|
| 2012/0212390 | A1 | 8/2012 | Lan | |
| 2012/0280876 | A1 | 11/2012 | Qu | |
| 2013/0050049 | A1* | 2/2013 | Liu et al. ............ | 343/860 |

FOREIGN PATENT DOCUMENTS

| CN | 201323599 | Y | 10/2009 |
|---|---|---|---|
| CN | 101697378 | A | 4/2010 |
| CN | 101778162 | A | 7/2010 |
| CN | 101800361 | A | 8/2010 |
| CN | 101847214 | A | 9/2010 |
| CN | 101867385 | A | 10/2010 |
| CN | 102158246 | A | 8/2011 |
| CN | 102158246 | B | 11/2013 |
| EP | 2199920 | A1 | 6/2010 |
| EP | 2660986 | A1 | 11/2013 |

OTHER PUBLICATIONS

Extended European Search Report received in Application No. 12739833.7-1852 mailed Nov. 19, 2013, 6 pages.
International Search Report received in International Application No. PCT/CN2012/070585, mailed Apr. 26, 2012, 7 pages.
Written Opinion of the International Searching Authority received in International Application No. PCT/CN2012/070585, mailed Apr. 26, 2012, 14 pages.

* cited by examiner

WIRELESS TERMINAL

CROSS-REFERENCE TO RELATED APPLICATIONS

This application is a continuation of International Application No. PCT/CN2012/070585, filed on Jan. 19, 2012, which claims priority to Chinese Patent Application No. 201110030267.1, filed with the Chinese Patent Office on Jan. 27, 2011, both of which are incorporated herein by references in their entireties.

FIELD OF THE INVENTION

Embodiments of the present invention relate to a communication technology, and in particular embodiments, to a wireless terminal.

BACKGROUND OF THE INVENTION

With the development of wireless communication technologies, more wireless terminals, such as data cards and M2M wireless modules, are emerging. A wireless terminal may be connected, by using a data connector (for example, a USB data connector) of the wireless terminal, through a port (for example, a USB port) of a terminal device (for example, a notebook computer), to the terminal device. In the prior art, the data connector of a wireless terminal is rotatable so that the wireless terminal, whichever position it rotates to, can be connected to a terminal device.

However, when the wireless terminal rotates close to the terminal device, the antenna of the wireless terminal may be affected by the ground of the main board of the terminal device. This decreases the radiation efficiency of the antenna and impairs the radio performance of the wireless terminal.

SUMMARY OF THE INVENTION

Embodiments of the present invention provide a wireless terminal to improve radio performance of the wireless terminal.

An embodiment of the present invention provides a wireless terminal including a PCB, an antenna, and a data connector. The PCB has a groove, which divides the PCB into a first part and a second part. The second part is connected to the antenna, the first part is connected to the data connector through a rotating shaft, and connecting wires of the data connector are connected to the second part.

The first part and the second part each have a ground. The ground of the first part is connected to a metal casing of the data connector. A ground wire of the data connector is connected to the ground of the second part and the ground wire of the data connector is electrically connected to the metal casing of the data connector.

As can be known from the technical solution, in the embodiments of the present invention, a groove is formed by cutting on the PCB to divide the PCB into two parts so as to produce a distributed capacitance effect and the connecting wires of the data connector may produce a distributed inductance effect, so that a resonant circulating current is formed. In this way, the radiation current on the entire PCB may be formed by two parts. One part is an excitation current generated by the antenna. The other part is a resonant circulating current generated by a resonant network including the connecting wires of the data connector, the second part of the PCB, the groove (equivalent to a capacitor with fixed capacitance), the first part of the PCB, and the metal casing of the data connector. Due to presence of the resonant circulating current, the electromagnetic radiation capability of the PCB is enhanced, and further the radiation capability of the entire wireless terminal is enhanced, so that the radio performance of the wireless terminal is improved, thereby effectively guaranteeing the radio performance of the wireless terminal in various application scenarios. In addition, the wireless terminal according to the embodiments of the present invention is easy to implement and has a low cost.

BRIEF DESCRIPTION OF THE DRAWINGS

To describe the technical solutions in the embodiments of the present invention more clearly, the following briefly introduces the accompanying drawings required for describing the embodiments or the prior art. Apparently, the accompanying drawings in the following description show some embodiments of the present invention, and persons of ordinary skill in the art may still derive other drawings from these accompanying drawings without creative efforts.

DETAILED DESCRIPTION OF THE EMBODIMENTS

To make the objectives, technical solutions, and advantages of the embodiments of the present invention more comprehensible, the following clearly describes the technical solutions in the embodiments of the present invention with reference to the accompanying drawings in the embodiments of the present invention. Apparently, the described embodiments are merely a part rather than all of the embodiments of the present invention. All other embodiments obtained by persons of ordinary skill in the art based on the embodiments of the present invention without creative efforts shall fall within the protection scope of the present invention.

In the embodiments of the present invention, a wireless terminal may include but is not limited to a data card or a machine-to-machine (M2M) wireless module. A terminal device may include but is not limited to a computer or a household appliance (such as a refrigerator, a water meter, and an electric meter). The wireless terminal may be connected to the terminal device through a port (for example, a USB port) of the terminal device.

Figure 1:
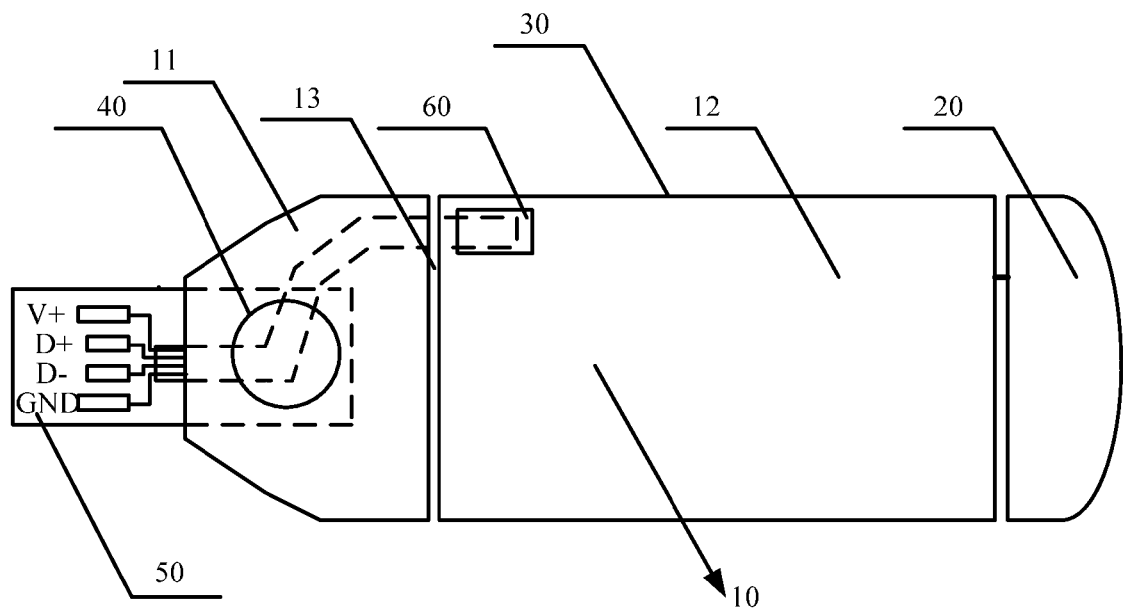
FIG. 1 is a schematic structural diagram of a wireless terminal according to a first embodiment of the present invention.

FIG. 1 is a schematic structural diagram of a wireless terminal according to a first embodiment of the present invention. In this embodiment, the wireless terminal may include a printed circuit board (PCB) 10, an antenna 20, and a data connector 50, and may further include a casing 30. The PCB has a groove 13, which divides the PCB 10 into a first part 11 and a second part 12. The second part 12 is connected to the antenna 20, and the first part 11 is connected to the data connector 50 through a rotating shaft 40 (which may specifically be a piece of metalwork). Connecting wires of the data connector 50 (including a power wire, a ground wire, and a data wire) are connected to the second part 12 so that the connecting wires of the data connector 50, the second part 12, the groove 13, the first part 11, and the metal casing of the data connector 50 form a resonant network for generating a resonant circulating current. Particularly, the connecting wires (power wire V+, data wires D+ and D−, and ground wire GND) of the data connector 50 are connected to the second part 12 through a cable pad 60.

The first part 11 and the second part 12 each have a ground. The ground of the first part 11 is connected to the metal casing of the data connector 50 (specifically, may be connected to the metal casing of the data connector 50 through the metal rotating shaft 40), and the ground wire (GND) of the data connector 50 is connected to the ground of the second part 12 (specifically, may be connected to the ground of the second part 12 through the cable pad 60). In addition, the ground wire (GND) of the data connector 50 is electrically connected to the metal casing of the data connector 50.

The data connector 50 in this embodiment may specifically be a USB connector, a serial port connector, a 1394 connector, and other data connectors. The following description is given by taking the USB connector as an example. In this embodiment, the groove 13 is formed by cutting on the PCB to divide the PCB into two parts so as to produce a distributed capacitance effect. One part (the second part 12) is used for layout of chips such as a baseband chip and a radio frequency chip and other components; the other part (the first part 11) is used for being connected to the rotating shaft 40.

Connecting wires (including a power wire and data wires) of the USB connector may be connected, through a USB cable, to the cable pad 60 arranged on the second part 12 at one end of the groove 13, thereby producing a distributed inductance effect. In this way, the radiation current on the entire PCB 10 may be formed by two parts. One part is an excitation current generated by the antenna 20. The other part is a resonant circulating current generated by a resonant circuit including the connecting wires of the data connector 50 (which are equivalent to an inductor with fixed inductance and capable of producing a distributed inductance effect), the second part 12, the groove 13 (equivalent to a capacitor with fixed capacitance and capable of producing a distributed capacitance effect), the first part 11, and the metal casing of the data connector 50.

Due to presence of the resonant circulating current, the electromagnetic radiation capability of the PCB is enhanced, and further the radiation capability of the entire wireless terminal is enhanced, so that the radio performance of the wireless terminal is improved, thereby effectively guaranteeing the radio performance of the wireless terminal in various application scenarios. In addition, the wireless terminal according to the embodiment of the present invention is easy to implement and has a low cost.

Figure 2:
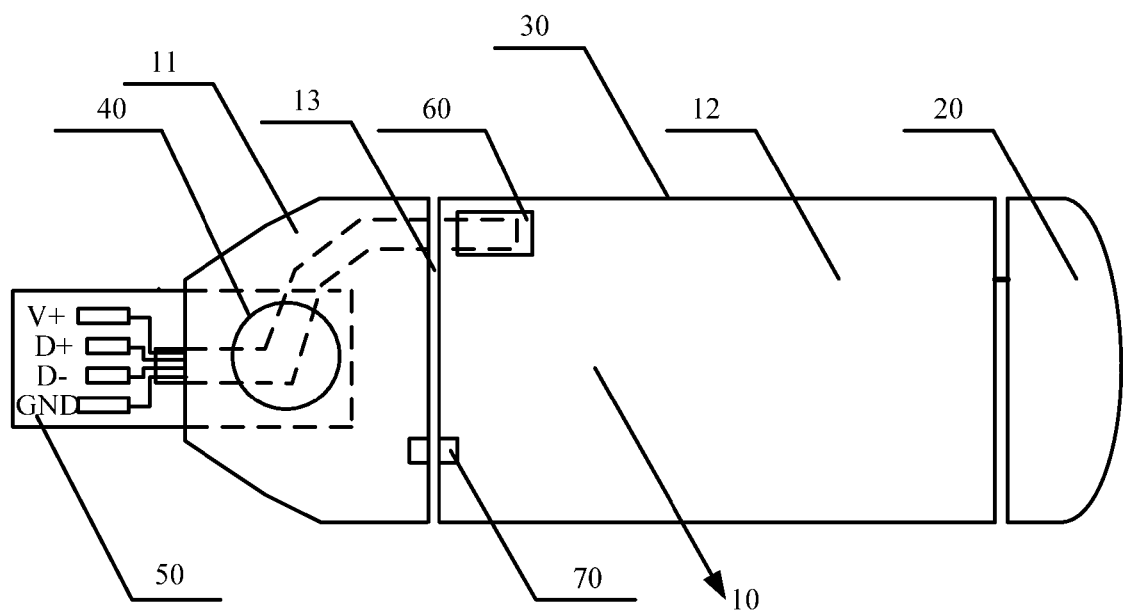
FIG. 2 is a schematic structural diagram of a wireless terminal according to a second embodiment of the present invention.

FIG. 2 is a schematic structural diagram of a wireless terminal according to a second embodiment of the present invention. The wireless terminal in this embodiment, based on the previous embodiment, may have a circuit network 70 loaded at the other end of the groove that is opposite to the cable pad 60. The circuit network 70 is connected to the ground of the first part 11 and the ground of the second part 12 respectively to establish a resonant connection between the metal casing of the USB connector and the second part 12 through the first part 11, so that the connecting wires of the data connector 50, the second part 12, the circuit network 70, and the metal casing of the data connector 50 form a resonant network for generating a resonant circulating current. As known by persons skilled in the art, the word "load" here refers to bridging two sides of the groove.

In particular, the circuit network in this embodiment may specifically be a resonant circuit, which may be formed by an inductor L or a capacitor C, or implemented by a combination of any two or three of a resistor R, the capacitor C, and the inductor L. That is, the resonant circuit in this embodiment may be implemented by an inductor, or a capacitor, or a combination of a resistor and a capacitor, or a combination of a resistor and an inductor, or a combination of an inductor and a capacitor, or a combination of a resistor, a capacitor, and an inductor.

In this embodiment, the data connector 50 may be a USB connector specifically. The following description is given by taking the USB connector as an example. In this embodiment, a groove is formed by cutting on the PCB to divide the PCB into two parts. One part (the second part 12) is used for layout of chips such as a baseband chip and a radio frequency chip and other components; the other part (the first part 11) is used for being connected to the rotating shaft 40. Connecting wires (including a power wire and data wires) of the USB connector may be connected, through a USB cable, to the cable pad 60 arranged on the second part 12 at one end of the groove, thereby producing a distributed inductance effect.

A circuit network is loaded at the other end of the groove that is opposite to the cable pad 60, so as to establish a resonant connection between the metal casing of the USB connector and the second part 12 through the first part 11, so that a distributed capacitance effect is produced. In this way, the radiation current on the entire PCB 10 may be formed by two parts. One part is an excitation current generated by the antenna 20. The other part is a resonant circulating current generated by a resonant network including the connecting wires of the data connector, the second part of the PCB, the circuit network 70 (equivalent to a variable resonant circuit), the first part of the PCB, and the metal casing of the data connector.

Due to presence of the resonant circulating current, the electromagnetic radiation capability of the PCB is enhanced, and further the radiation capability of the entire wireless terminal is enhanced, so that the radio performance of the wireless terminal is improved, thereby effectively guaranteeing the radio performance of the wireless terminal in various application scenarios. In addition, the wireless terminal according to the embodiment of the present invention is easy to implement and has a low cost.

Figure 3:
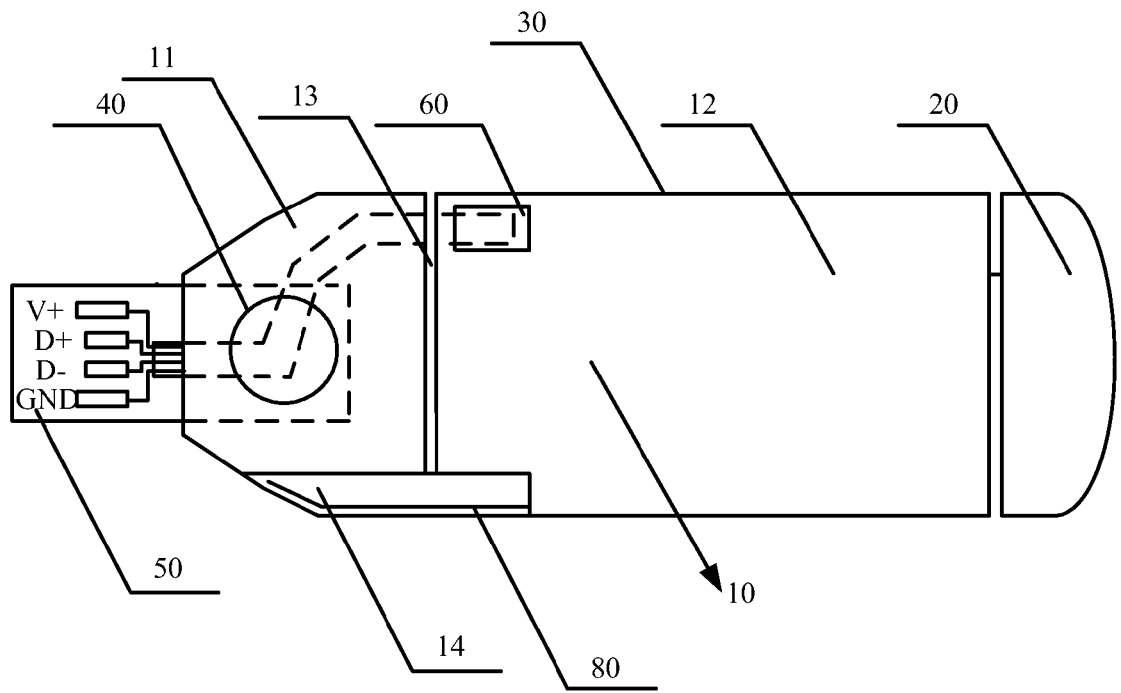
FIG. 3 is a schematic structural diagram of a wireless terminal according to a third embodiment of the present invention.
Figure 4:
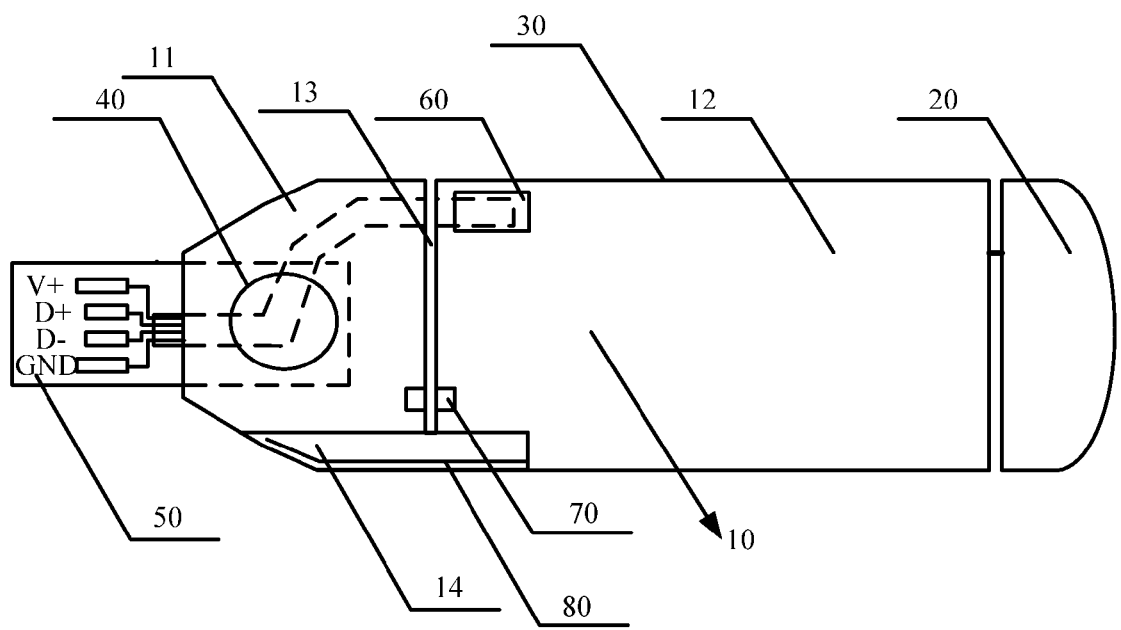
FIG. 4 is a schematic structural diagram of a wireless terminal according to a fourth embodiment of the present invention.

Furthermore, as shown in FIG. 3 or FIG. 4, in this embodiment, based on the first or second embodiment of the present invention, a portion of the PCB 10, adjacent to the rotating shaft 40, of the wireless terminal is left uncoated by copper, that is, both the first part 11 and the second part 12 have a portion uncoated to form a third part 14, and a diversity antenna 80 is arranged in the third part 14. The circuit network 70 is loaded at the other end of the groove that is opposite to the cable pad 60, and connected to the ground of the first part 11 and the ground of the second part 12 respectively.

Finally, it should be noted that the foregoing embodiments are merely intended for describing the technical solutions of the present invention other than limiting the present invention. Although the present invention is described in detail with reference to the foregoing embodiments, persons of ordinary skill in the art should understand that they may still make modifications to the technical solutions described in the foregoing embodiments or make equivalent replacements to some technical features thereof, without departing from the spirit and scope of the technical solutions of the embodiments of the present invention.

What is claimed is:

1. A wireless terminal, comprising:
   a printed circuit board PCB;
   an antenna; and
   a data connector;
   wherein the PCB has a groove that divides the PCB into a first part and a second part, wherein the second part is connected to the antenna, the first part is connected to the data connector through a rotating shaft, the rotating shaft being positioned over the first part, and connecting wires of the data connector are connected to the second part; and
   wherein the first part and the second part each have a ground, wherein the ground of the first part is connected to a metal casing of the data connector, a ground wire of the data connector is connected to the ground of the second part and the ground wire of the data connector is electrically connected to the metal casing of the data connector.

2. The wireless terminal according to claim 1, wherein the connecting wires of the data connector are connected to the second part through a cable pad and wherein the ground wire of the data connector is connected to the ground of the second part through the cable pad.

3. The wireless terminal according to claim 2, wherein a portion of the PCB, adjacent to the rotating shaft, is left uncoated by copper to form a third part and a diversity antenna is arranged in the third part.

4. The wireless terminal according to claim 1, wherein the data connector comprises a USB data connector.

5. The wireless terminal according to claim 4, wherein a portion of the PCB, adjacent to the rotating shaft, is left uncoated by copper to form a third part and a diversity antenna is arranged in the third part.

6. The wireless terminal according to claim 1, wherein a circuit network is loaded on the groove and connected to the ground of the first part and the ground of the second part respectively.

7. The wireless terminal according to claim 6, wherein the circuit network comprises an inductor.

8. The wireless terminal according to claim 7, wherein a portion of the PCB, adjacent to the rotating shaft, is left uncoated by copper to form a third part and a diversity antenna is arranged in the third part.

9. The wireless terminal according to claim 6, wherein the circuit network comprises a capacitor.

10. The wireless terminal according to claim 9, wherein a portion of the PCB, adjacent to the rotating shaft, is left uncoated by copper to form a third part and a diversity antenna is arranged in the third part.

11. The wireless terminal according to claim 6, wherein the circuit network comprises a combination of an inductor and a resistor, a combination of a capacitor and a resistor, or a combination of an inductor, a capacitor and a resistor.

12. The wireless terminal according to claim 6, wherein a portion of the PCB, adjacent to the rotating shaft, is left uncoated by copper to form a third part and a diversity antenna is arranged in the third part.

13. The wireless terminal according to claim 1, wherein a portion of the PCB, adjacent to the rotating shaft, is left uncoated by copper to form a third part.

14. The wireless terminal according to claim 13, wherein a diversity antenna is arranged in the third part.

15. A wireless terminal, comprising:
    a printed circuit board PCB that has a groove that divides the PCB into a first part and a second part, wherein the first part and the second part each have a ground;
    a rotating shaft;
    an antenna connected to the first part of the PCB;
    a USB data connector overlying the first part and connected to the second part of the PCB through the rotating shaft, connecting wires of the USB data connector being connected to the second part through a cable pad and a ground wire of the USB data connector being connected to the ground of the second part through the cable pad; and
    a circuit network loaded on the groove and connected to the ground of the first part and the ground of the second part, respectively;
    wherein the ground of the first part is electrically connected to a metal casing of the USB data connector and the ground wire of the USB data connector is electrically connected to the metal casing of the USB data connector.

16. The wireless terminal according to claim 15, wherein a portion of the PCB, adjacent to the rotating shaft, is left uncoated by copper to form a third part.

17. The wireless terminal according to claim 16, wherein a diversity antenna is arranged in the third part.

18. The wireless terminal according to claim 15, wherein the circuit network comprises an inductor.

19. The wireless terminal according to claim 15, wherein the circuit network comprises a capacitor.

* * * * *